United States Patent [19]
Heminger et al.

[11] Patent Number: 5,751,052
[45] Date of Patent: May 12, 1998

[54] INDUCTIVE DRIVER CIRCUIT AND METHOD THEREFOR

[75] Inventors: David M. Heminger, Mesa; Vincent L. Mirtich, Scottsdale; William H. Grant, Mesa, all of Ariz.

[73] Assignee: Motorola, Inc., Schaumburg, Ill.

[21] Appl. No.: 617,722

[22] Filed: Apr. 1, 1996

[51] Int. Cl.[6] .................................................. H01L 27/082

[52] U.S. Cl. .......................... 257/577; 257/582; 257/531; 257/539; 257/603

[58] Field of Search ................................ 257/577, 582, 257/531, 539, 603

[56] References Cited

U.S. PATENT DOCUMENTS

| | | | |
|---|---|---|---|
| 4,293,868 | 10/1981 | Iizuka et al. | 257/577 |
| 4,456,920 | 6/1984 | Iesaka | 257/577 |
| 4,672,402 | 6/1987 | Yamaoka et al. | 257/577 |

Primary Examiner—Mark V. Prenty
Attorney, Agent, or Firm—Robert F. Hightower

[57] ABSTRACT

An inductive driver circuit (10) has a driver transistor (11) that is used for driving loads. An input protection device (13) and a voltage suppression device (12) assist in protecting the transistor (11). The circuit (10), including the driver transistor (11) and the input protection device (13), are formed in a common collector region.

19 Claims, 1 Drawing Sheet

INDUCTIVE DRIVER CIRCUIT AND METHOD THEREFOR

BACKGROUND OF THE INVENTION

The present invention relates, in general, to semiconductors, and more particularly, to a novel semiconductor circuit. In the past, a variety of different circuit configurations have been utilized as driver circuits for inductive loads. The specific circuitry usually is determined based on the current required by the load. One particular circuit for applications requiring low currents, typically less than about 300 milliamps, utilizes a single driver transistor. The application requires that the transistor have a high gain, typically greater than beta of 300, and a low saturation voltage, less than approximately 0.2 volts, and power dissipation less than 125 milliwatts. However, prior circuits usually do not meet these parameters, but have higher saturation voltages, typically above 0.5 volts, thereby resulting in higher power dissipation. Such prior circuits often include a zener diode across the output of the transistor, and a diode across the base emitter junction of the transistor. Additionally such circuits are discrete, that is, implemented with individually packaged transistors, diodes, and resistors.

Because individually packaged transistors, resistors, and diodes are utilized, a printed circuit board is required and each device must be inserted into the printed circuit board and assembled. This results in a long cycle time for the manufacturing process, higher costs, and larger system size.

Accordingly, it is desirable to have an inductive driver circuit that is integrated onto a single substrate, that has a low cost, a high gain, and a low saturation voltage and low power dissipation while driving a load.

DETAILED DESCRIPTION OF THE DRAWINGS

Figure 1:
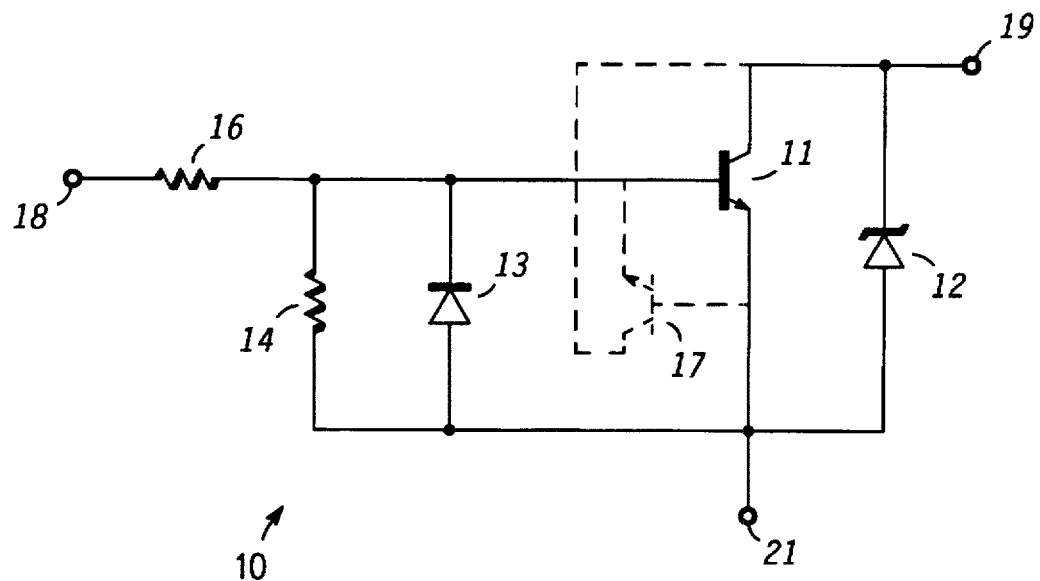
FIG. 1 schematically illustrates a driver circuit in accordance with the present invention.

FIG. 1 schematically illustrates an inductive driver circuit 10 that is integrated and formed on a single semiconductor substrate. Circuit 10 includes a driver transistor 11 that has a first current electrode or collector connected to an output 19 of circuit 10. Transistor 11 also has a second current electrode or emitter connected to a voltage return 21 of circuit 10, and a control electrode or base that is connected to other portions of circuit 10. A zener diode 12 functions as a voltage suppression device that is connected in parallel across transistor 11. Diode 12 protects transistor 11 against inductive kick-back voltages when turning-off loads. Other types of voltage suppression devices, such as multiple series diodes or back-to-back polydiodes, could also be used. This protection allows transistor 11 to have a low breakdown voltage and high gain without resulting in damage to transistor 11. Diode 12 has an anode connected to the emitter of transistor 11, and a cathode connected to the collector. A diode 13 is connected in parallel with the control electrode or base of transistor 11 and functions as an input protection device. Diode 13 protects the emitter-base junction of transistor 11 against reverse input voltage spikes caused by ground bounce or other noise especially during switching of inductive loads. Diode 13 has an anode connected to the emitter of transistor 11, and a cathode connected to the base, thus, diode 13 is connected in parallel with the base of transistor 11. A shunt resistor 14 is connected in parallel with diode 13. Resistor 14 shunts leakage current from devices connected to input 18 as well as internally generated leakage currents and prevents turning-on transistor 11 inadvertently, thereby increasing the noise immunity of circuit 10. An input resistor 16 is connected in series between an input 18 of circuit 10 and the base of transistor 11. Resistor 16 limits the base current to transistor 11 thereby preventing damage to transistor 11, and increases the isolation from the load on output 19 back to input 18.

In order to ensure that circuit 10 has a low saturation voltage while driving loads, transistor 11 and diodes 12 and 13 are formed in a common collector region as will be explained further hereinafter. Because of the common collector region, diodes 12 and 13 form a parasitic transistor 17, illustrated by dashed lines, formed across transistor 11. Also due to the common collector region, resistor 16 is formed as a polysilicon resistor in order to prevent forming a parasitic diode between resistor 16 and the collector of transistor 11 thereby limiting base drive current to transistor 11. Utilizing a polysilicon resistor also allows controlling the value of resistor 16 independently for different applications.

Figure 2:
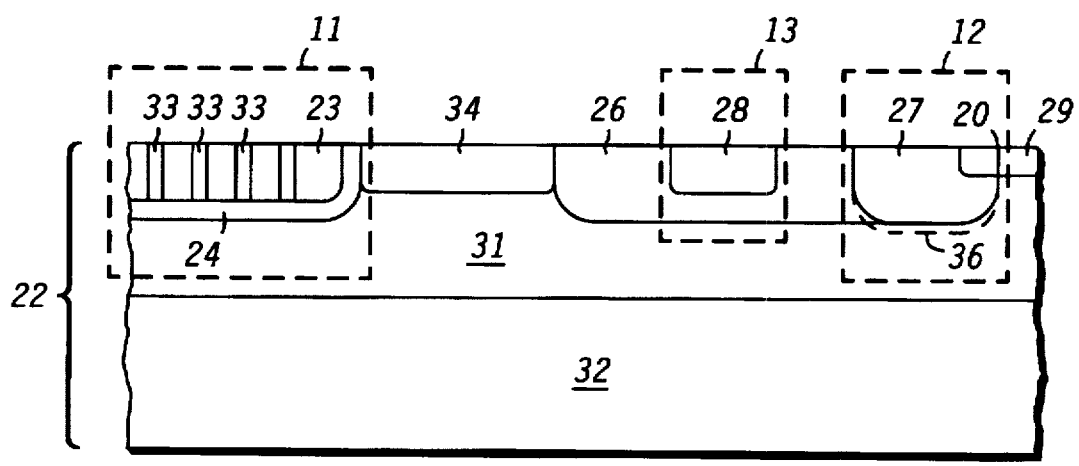
FIG. 2 is an enlarged cross-sectional view of a portion of the driver circuit of FIG. 1 in accordance with the present invention.

FIG. 2 is a cross-sectional view of an integrated circuit showing portions of a substrate 22 on which circuit 10 is formed. Elements of FIG. 2 that have the same reference numerals as FIG. 1 refer to the corresponding FIG. 1 elements. Portions of transistor 11, resistor 14, and diodes 12 and 13 from FIG. 1 are illustrated by dashed lines or boxes and labeled with the corresponding reference numbers. Substrate 22 forms a common connection between transistor 11 and diode 12 due to the common collector region.

In the preferred embodiment, resistors 14 and 16 are also formed on substrate 22 in the common collector region. Also, substrate 22 includes a silicon wafer 32 on which an epitaxial layer 31 is formed. Accordingly, transistor 11, diodes 12 and 13, and resistors 14 and 16 are formed on layer 31 of substrate 22. In this preferred embodiment, substrate 22 is an N-type substrate having an N-type silicon wafer 32 and N-type layer 31. Layer 31 is very thin in order to provide low saturation voltage and also facilitates high current gain at high collector currents. The thinness of layer 31 also lowers the breakdown voltage of transistor 11, however, diode 12 protects transistor 11 against breakdown damage. In the preferred embodiment, layer 31 is less than approximately seven microns thick, and has a doping concentration of approximately $1 \times 10^{15}$ atoms/cm$^3$.

Transistor 11 includes a base 24 that is a diffused area on substrate 22, and an emitter 23 that is a diffused area within base 24. In the preferred embodiment, base 24 is doped P-type, and emitter 23 is doped N-type. Emitter 23 is formed as a deep emitter in order to provide high beta for transistor 11. In the preferred embodiment, emitter 23 is at least approximately three microns deep so that transistor 11 has a beta of at least three hundred. Additionally, emitter 23 has an area, that is almost as large as base 24 in order to reduce the saturation resistance of transistor 11. Emitter 23 is formed as a mesh emitter in order to facilitate electrical contact to base 24. The mesh emitter is formed by using emitter feedthroughs 33 through emitter 23 to facilitate contact with base 24 as is well known to those skilled in the art.

The common collector region results in diode 12 having an anode that is formed within the anode area of diode 13. This also reduces the amount of area used for diodes 12 and 13 thereby resulting in lower costs. Diode 13 includes a first doped area 26 that is formed on substrate 22. Area 26 forms the anode of diode 13. Area 26 has a conductivity type that is opposite to that of substrate 22, and a first doping concentration. In the preferred embodiment, area 26 has a P-type doping surface concentration of approximately $3\times10^{17}$atoms/cm$^3$. The cathode of diode 13 is formed as a doped area 28 within area 26. Area 28 has an opposite conductivity type to area 26. It should be noted that diode 13 can also be formed as a poly-diode having a polysilicon cathode. In such a configuration, the anode can still be formed in the common collector region. A poly-diode can also be formed utilizing both a polysilicon anode and cathode, which would eliminate parasitic transistor 17 (FIG. 1). It should be noted that diode 13 is connected to transistor 11 by metallization (not shown) between area 26 and emitter 23 and between area 28 and base 24.

Because of the common collector region, diode 12 must be built laterally and not vertically to allow precise targeting of the voltage of diode 12 through controlling surface doping concentrations. In order to reduce the amount of area used for diode 12, the anode is formed as a doped area 27 substantially within the anode of diode 13. Consequently, area 27 is formed after forming area 26. Because area 27 has a higher concentration than area 26, area 27 may extend deeper into substrate 22 than area 26 as shown by dashed line 36.

It is important than the zener voltage be less than the emitter-collector breakdown voltage of transistor 11 in order to protect transistor 11. The zener voltage of diode 12 is controlled by doping area 27 separately from area 26 and at a doping concentration that is higher than the doping concentration of area 26. In the preferred embodiment, area 27 has a P-type surface doping concentration of approximately $1.2\times10^{18}$atoms/cm$^3$ to obtain a zener breakdown voltage no greater than approximately twelve volts and preferably about 6.8 volts. The cathode of diode 12 is formed by a doped area 29 that intersects area 27. Area 29 has a conductivity type that is opposite to area 27. In the preferred embodiment, area 29 has an N-type doping concentration of approximately $1\times10^{18}$atoms/cm$^3$. Also in the preferred embodiment, area 29 is a channel stop diffusion that extends through the scribe gird used for separating die on a wafer. Using the channel stop diffusion for forming area 29 minimizes the size of diode 12. Also, forming area 27 within area 26 provides diode 12 with a large current capability for a small area. The junction region of diode 12 is formed along the interface of areas 27 and 29. Consequently, breakdown occurs at the surface near point 20. Thus, the size of areas 27 and 29 can be very small. In the preferred embodiment, diode 12 has a size of approximately twelve hundred microns long by ten to fifteen microns wide, and a peak current capability of at least approximately one amp and a DC current capability of at least approximately thirty milliamps.

A doped area 34 functions as resistor 14 (FIG. 1). Area 34 is formed within substrate 22, thus, resistor 14 is within the collector of transistor 11. Typically, area 34 is formed when forming base 24 and has similar doping concentrations and depth.

Although shown and discussed as an NPN transistor, one skilled in the art will notice that transistor 11 can be formed as a PNP transistor by reversing the doping types of the transistor and other areas, e.g. from N-type to P-type.

By now it should be appreciated that there has been provided a novel driver circuit. Forming the circuit elements on a single semiconductor substrate in a common collector region facilitates providing a low saturation voltage. The common collector region eliminates separate isolation tubs that are used for other circuits. Isolation tubs cause current to flow larger distances through the substrate between elements of such circuits thereby increasing saturation voltages. Circuit 10 has a saturation voltage of less than approximately 0.2 volts while driving a 250 milliamp load with an input current of less than 2.5 milliamps, and has power dissipation of less than approximately fifty milliwatts. The integrated circuit configuration results in low costs for circuit 10. Also, circuit 10 results in low manufacturing cycle time because fewer components are used in application circuits. Consequently, circuit 10 can be used for inductive loads in telecommunications and other types of circuit applications.

We claim:

1. A method of forming an inductive driver circuit comprising:

providing a substrate;

forming a driver transistor on the substrate, the driver transistor having a collector, a base, and an emitter;

forming an input protection device on the substrate;

forming a voltage suppression device on the substrate, the voltage suppression device having an anode formed within the collector wherein a cathode of the voltage suppression device has a higher doping concentration than an anode of the voltage suppression device; and forming a shunt resistor on the substrate wherein the shunt resistor is coupled between the base and the emitter of the driver transistor.

2. A method of forming an inductive driver circuit comprising:

a substrate;

forming a driver transistor on the substrate, the driver transistor having a collector, a base, and an emitter;

forming an input protection device on the substrate;

forming a voltage suppression device on the substrate, the voltage suppression device having an anode formed within the collector by forming the anode of the voltage suppression device substantially within an anode of the input protection device; and forming a shunt resistor on the substrate wherein the shunt resistor is coupled between the base and the emitter of the driver transistor.

3. A method of forming an inductive driver circuit comprising:

providing a substrate;

forming a driver transistor on the substrate, the driver transistor having a collector, a base, and an emitter;

forming an input protection device on the substrate;

forming a voltage suppression device on the substrate, the voltage suppression device having an anode formed within the collector and using a portion of a channel stop for forming a cathode of the voltage suppression device and;

forming a shunt resistor on the substrate wherein the shunt resistor is coupled between the base and the emitter of the driver transistor and wherein the shunt resistor is formed within the collector of the driver transistor.

4. The method of claim 3 wherein forming the driver transistor includes forming the emitter as a mesh emitter.

5. The method of claim 3 wherein forming the voltage suppression device on the substrate includes forming a first doped area having a first conductivity type and a first doping concentration; then forming a second doped area within the first doped area, the second doped area having the first conductivity type and a second doping concentration that is greater than the first doping concentration.

6. An inductive driver circuit comprising:

a substrate;

a driver transistor formed on the substrate, the driver transistor having a control electrode;

a voltage suppression device coupled in parallel across the driver transistor wherein the driver transistor and the voltage suppression device are formed on the substrate in a common collector region and wherein a cathode of the voltage suppression device has a higher doping concentration than an anode of the voltage suppression device;

an input resistor formed on the substrate, the input resistor coupled in series with the control electrode of the driver transistor;

an input protection device formed on the substrate, the input protection device coupled in parallel with the control electrode of the driver transistor; and a shunt resistor formed on the substrate, the shunt resistor coupled in parallel with the control electrode of the driver transistor.

7. The inductive driver circuit of claim 6 further including the input resistor formed in the common collector region.

8. An inductive driver circuit comprising:

a substrate;

a driver transistor formed on the substrate, the driver transistor having a control electrode;

a voltage suppression device coupled in parallel across the driver transistor wherein the driver transistor and the voltage suppression device are formed on the substrate in a common collector region;

an input resistor formed on the substrate, the input resistor coupled in series with the control electrode of the driver transistor;

an input Protection device formed on the substrate, the input protection device coupled in parallel with the control electrode of the driver transistor wherein an anode of the voltage suppression device is formed substantially within an anode of the input protection device; and a shunt resistor formed on the substrate, the shunt resistor coupled in parallel with the control electrode of the driver transistor.

9. The inductive driver circuit of claim 8 wherein the anode of the input protection device includes a first doped area having a first conductivity type and a first doping concentration and the anode of the voltage suppression device includes a second doped area having the first conductivity type and a second doping concentration that is greater than the first doping concentration.

10. The inductive driver circuit of claim 9 wherein a cathode of the voltage suppression device includes a third doped area having a second conductivity type.

11. The inductive driver circuit of claim 10 wherein the cathode of the voltage suppression device is formed as a portion of a channel stop region.

12. The inductive driver circuit of claim 8 wherein the input protection device and the voltage suppression device form a parasitic transistor.

13. The inductive driver circuit of claim 8 wherein the voltage suppression device is a zener diode.

14. The inductive driver circuit of claim 8 wherein the input protection device is a diode.

15. The inductive driver circuit of claim 8 wherein the input resistor is an implanted polysilicon resistor.

16. An inductive driver circuit comprising:

a substrate;

a driver transistor formed on the substrate, the driver transistor having a first current electrode coupled to an output of the inductive driver circuit, a second current electrode coupled to a voltage return of the inductive driver circuit, and a control electrode;

a voltage suppression device formed on the substrate, the voltage suppression device coupled in parallel between the first and second current electrodes of the driver transistor wherein the driver transistor and the voltage suppression device are formed in a common collector region;

an input resistor formed on the substrate, the input resistor coupled in series with the control electrode;

an input protection device formed on the substrate, the input protection device coupled in parallel between the control electrode and the second current electrode of the driver transistor; and a shunt resistor formed on the substrate, the shunt resistor coupled in parallel between the control electrode and the second current electrode of the driver transistor.

17. The circuit of claim 16 wherein the voltage suppression device and the input protection device form a parasitic transistor.

18. The circuit of claim 16 wherein an anode of the voltage suppression device is formed substantially within an anode of the input protection device.

19. The circuit of claim 18 wherein the anode of the input protection device includes a first doped area having a first conductivity type and a first doping concentration and the anode of the voltage suppression device includes a second doped area having the first conductivity type and a second doping concentration that is greater than the first doping concentration.

* * * * *

UNITED STATES PATENT AND TRADEMARK OFFICE
CERTIFICATE OF CORRECTION

PATENT NO.    : 5,751,052
DATED         : May 12, 1998
INVENTOR(S)   : David M. Heminger et al.

It is certified that error appears in the above-identified patent and that said Letters Patent is hereby corrected as shown below:

Column 4,
Line 33, delete "a substrate;" and add -- providing a substrate; --.

Signed and Sealed this

Twenty-first Day of May, 2002

Attest:

JAMES E. ROGAN
*Attesting Officer*           *Director of the United States Patent and Trademark Office*